United States Patent [19]

Singhi et al.

[11] Patent Number: 5,345,510
[45] Date of Patent: Sep. 6, 1994

[54] INTEGRATED SPEAKER SUPERVISION AND ALARM SYSTEM

[75] Inventors: Dilip Singhi, Glenview; Kamlesh V. Patel, Streamwood, both of Ill.

[73] Assignee: Rauland-Borg Corporation, Skokie, Ill.

[21] Appl. No.: 912,825

[22] Filed: Jul. 13, 1992

[51] Int. Cl.⁵ .................................... H04B 3/00
[52] U.S. Cl. ............................. 381/77; 381/82; 381/55
[58] Field of Search .................. 381/55, 77, 82, 59

[56] References Cited

U.S. PATENT DOCUMENTS

| | | |
|---|---|---|
| 2,139,006 | 12/1938 | Durst et al. |
| 3,021,398 | 2/1962 | Barnett et al. |
| 3,051,788 | 8/1962 | Seeley |
| 3,656,158 | 4/1972 | Goodwater |
| 3,849,772 | 11/1974 | Burnett |
| 3,855,415 | 12/1974 | Fox et al. |
| 3,890,465 | 6/1975 | Kaizu ............................ 381/55 |
| 3,912,883 | 10/1975 | Goodyear |
| 3,989,908 | 11/1976 | Budrys et al. |
| 4,100,380 | 7/1978 | Gosswiller |
| 4,110,571 | 8/1978 | Hills |
| 4,554,533 | 11/1985 | Bosnak |
| 4,723,292 | 2/1988 | Taylor |

FOREIGN PATENT DOCUMENTS 60-93900  5/1985  Japan .

Primary Examiner—Forester W. Isen
Attorney, Agent, or Firm—Leydig, Voit & Mayer, Ltd.

[57] ABSTRACT

A system for monitoring the integrity of speakers and their associated wires using the pair of audio wires without disconnecting the speaker from the audio source. A direct current is injected onto the audio signal path and directed via a high impedance path through the speaker coil while any audio signals present drive the speaker through a low impedance path. The magnitude of the direct current is then evaluated at a central switching location and based on the value of the current, the status of the signal path is known to be either a good path, an open path, a shorted path or a grounded path. Alarm initiating devices may be connected to the wire pair and can be connected in such a way that the current on the wire pair indicates the status of the alarm indicating devices distinct from the currents corresponding to signal path integrity.

17 Claims, 4 Drawing Sheets

INTEGRATED SPEAKER SUPERVISION AND ALARM SYSTEM

FIELD OF THE INVENTION

This invention relates generally to speaker systems for communication and alarm signals, and more particularly to a supervised speaker and alarm integrated system.

BACKGROUND OF THE INVENTION

To be effective, and often to comply with local regulations, centrally located alarm switching systems such as fire alarms or burglar alarms require that the signal path integrity of connected speakers and their associated wiring be monitored regularly. Similarly, the wires that connect alarm initiating devices to the central switching location such as a fire alarm pull stations or smoke detectors must be regularly monitored. For this reason, the speakers and alarm initiating devices for alarm systems are generally wired separately from the speakers for intercom systems.

Typically, path integrity for the wiring and the speakers is verified by monitoring for wiring faults, specifically short circuits, open circuits, or grounded wiring or speaker connections. Prior art systems such as U.S. Pat. No. 3,849,883, U.S. Pat. No. 3,912,883 and U.S. Pat. No. 4,723,292, attempt to monitor speaker wire integrity by supplying a direct current on the speaker wires, blocking the direct current from flowing through the speaker coils, (generally with a series capacitor), but providing a resistor in parallel with the speaker coils to allow DC current flow. By evaluating this direct current flow, the wire pair can be tested for shorts or open circuits. However, these type of systems are unable to detect open speaker coils or problems in the connection between the speakers and the wire pair, since the parallel resistor will conduct the same amount of direct current regardless of whether the speaker coil is open or if the speaker coil is not even connected.

Other systems supervise path integrity by transmitting a signal carrying a subsonic or supersonic frequency through the audio pair of wires, and then separately picking up the signal near the speaker. For example, a dual cone system is used wherein one speaker generates the inaudible frequency and the other picks up this frequency. A corresponding signal is then separately returned on another wire pair so that the frequency and amplitude of the returned signal can be analyzed to determine if there are problems in the speaker or the path. However, this system is costly both in terms of parts and installation, as it requires a signal generator, some type of pick-up device, another pair of wires strung to the speaker location for returning the picked-up signal, and frequency detection means.

Moreover, these inaudible frequencies can cause problems with pets that are more frequency sensitive than humans, and are even reputed to cause problems with certain people. Consequently, the problems associated with broadcasting nearly audible frequencies, along with the extra expense of four wire systems and associated pick-ups, signal generators and detectors, render these systems less than desirable. Other frequencies further from the audible range are not used because these frequencies cause problems with the speaker design and bandwidth, and can create electronic interference.

As a result of the problems with frequency based testing, another type of testing is performed, where the alarm speakers are temporarily disconnected from their driving source and tested with a DC current. The current level through the circuit is evaluated to determine integrity of the signal path. However, this type of monitoring is not useable with intercom, public address, music, or paging type of systems because frequent interruption of the system is necessary. Indeed, some standards require that the integrity of each speaker and signal path be tested at least every 30 seconds. Even if elaborate switching electronics were designed to independently isolate and scan each speaker individually, the speakers would be interrupted at least every 30 seconds and therefore could not be employed satisfactorily as intercom, paging, or music speakers.

SUMMARY OF THE INVENTION

Accordingly, it is an object of the invention to provide a speaker supervision system that is capable of monitoring the path integrity of the speakers and associated pair of wires while allowing simultaneous transmission of audio signals.

It is a further object of the invention to provide continuous testing of the path integrity while using only the single pair of audio wires that are utilized to drive the speaker.

It is yet another object of the invention to provide a test system that can test the speaker as well as the wire pair by injecting a distinctive signal onto the wire pair which is then analyzed to determine path integrity, without requiring additional wires to return the injected signal.

It is yet another object of the invention to provide a test system that can test the speaker as well as the wire pair using only direct current.

It is another object of the invention to allow alarm initiating devices to utilize the same pair of wires for signalling the central switching location.

It is a resulting feature of the invention that the wire pairs can be electrically disconnected from amplified audio signals in the event of a short circuit.

In accordance with one important aspect of the invention, there is provided a supervision circuit for monitoring the path integrity in an audio system by injecting a distinctive signal through the wire pair and speaker coil itself, without disconnecting the wire pair and speaker from the audio signals. The audio system is of the type having a central switching location driving at least one speaker via a wire pair connecting the central switching location to the speaker. Injection means present at the central switching location inject the distinctive signal onto the same wire pair which drives the speaker, so that the signal passes through the speaker. Detecting means at the central switching location respond to the signal and evaluate the path integrity based on its condition. Control means, responsive to the status of the integrity of the connected wire pair and the speaker, indicate the nature of the signal detected.

In accordance with another important aspect of the invention, there is provided a supervision circuit for monitoring the path integrity in an audio system by injecting a direct current through the wire pair and speaker coil itself, without disconnecting the wire pair and speaker from the audio signals. The audio system is of the type having a central switching location driving at least one speaker via a wire pair connecting the central switching location to the speaker. Injection means present at the central switching location inject a DC current onto the same wire pair which drives the speaker, however a blocking capacitor prevents DC current from directly traversing the speaker. Bypass means associated with the speaker route the injected DC current through a path having additional impedance so that the injected DC current traverses the wire pair and the speaker. Detecting means at the central switching location respond to the DC current level and evaluate the path integrity based on the magnitude of the detected current. Control means, responsive to the status of the integrity of the connected wire pair and the speaker, indicate the nature of the current detected.

In general, in the preferred embodiment, the supervision system provides a direct current that flows through the pair of wires and through the speaker or speaker station itself by way of a high impedance path. Simultaneously, a low impedance path is available for audio signals to drive the speaker. At the central switching location, the direct current is converted to a voltage and evaluated, and based on the magnitude of the current, the system controller can take appropriate action as needed. If a short circuit is detected in the wire pair, the wire pair is electrically disconnected from the amplified signal source.

In accordance with another important aspect of the invention, alarm initiating devices may be connected to the same wire pair, so that the when activated, the devices will influence the distinctive signal injected in the wire pair. The supervision circuit then monitors both the path integrity of the audio system and the status of the alarm initiating devices. The audio system is of the type having a central switching location driving at least one speaker via a wire pair connecting the central switching location to the speaker. Injection means present at the central switching location inject a distinctive signal onto the same wire pair which drives the speaker, so that the signal passes through the wire pair and the speaker. Alarm initiating devices are connected to the wire pair and are arranged to influence the signal on the wire pair when activated. Detecting means at the central switching location respond to the signal and evaluate the path integrity and status of the alarm initiating devices based on the condition of the signal. Control means, responsive to the status of the integrity of the connected wire pair and the speaker, and to the status of the alarm initiating devices, indicate the nature of the current detected.

In accordance with another important aspect of the invention, alarm initiating devices may be connected to the same wire pair, so that the devices will influence the amount of direct current flow in the wire pair when activated. The supervision circuit then monitors both the path integrity of the audio system and the status of the alarm initiating devices. The audio system is of the type having a central switching location driving at least one speaker via a wire pair connecting the central switching location to the speaker. Injection means present at the central switching location inject a DC current onto the same wire pair which drives the speaker, however a blocking capacitor prevents DC current from directly traversing the speaker. Bypass means associated with the speaker route the injected DC current through a path having additional impedance so that the injected DC current traverses the wire pair and the speaker. Alarm initiating devices are connected to the wire pair and are arranged to influence the DC current level on the wire pair when activated. Detecting means at the central switching location respond to the DC current level and evaluate the path integrity and status of the alarm initiating devices based on the magnitude of the detected current. Control means, responsive to the status of the integrity of the connected wire pair and the speaker, and to the status of the alarm initiating devices, indicate the nature of the current detected.

Thus, if desired, alarm initiating devices can be attached to the same pair of wires, and do not have to be separately wired to the central switching location. Since current through the wire pair is evaluated, all that is necessary is that when activated, the alarm initiating device changes the current flow in the path enough to be detected at the central switching location. With the proper design, open circuits, short circuits, grounds, and the various alarm initiating devices can each create a uniquely different current in the wire pair that can be distinguished from the normal monitoring current. By detecting a voltage proportional to the amount of direct current in the wire, the system controller within the central switching location can be apprised of both the condition the signal path integrity and the status of alarm initiating devices connected to the circuit. The system controller can then take appropriate action such as sounding an alarm or driving a display to notify appropriate personnel of the particular problem.

Other objects and advantages will become apparent from the following detailed description when taken in conjunction with the drawings, in which:

DETAILED DESCRIPTION OF THE PREFERRED EMBODIMENTS

While the invention will be described in connection with a preferred embodiment, there is no intent to limit it to that embodiment. On the contrary, the intent is to cover all alternatives, modifications and equivalents included within the spirit and scope of the invention as defined by the appended claims.

Figure 1:
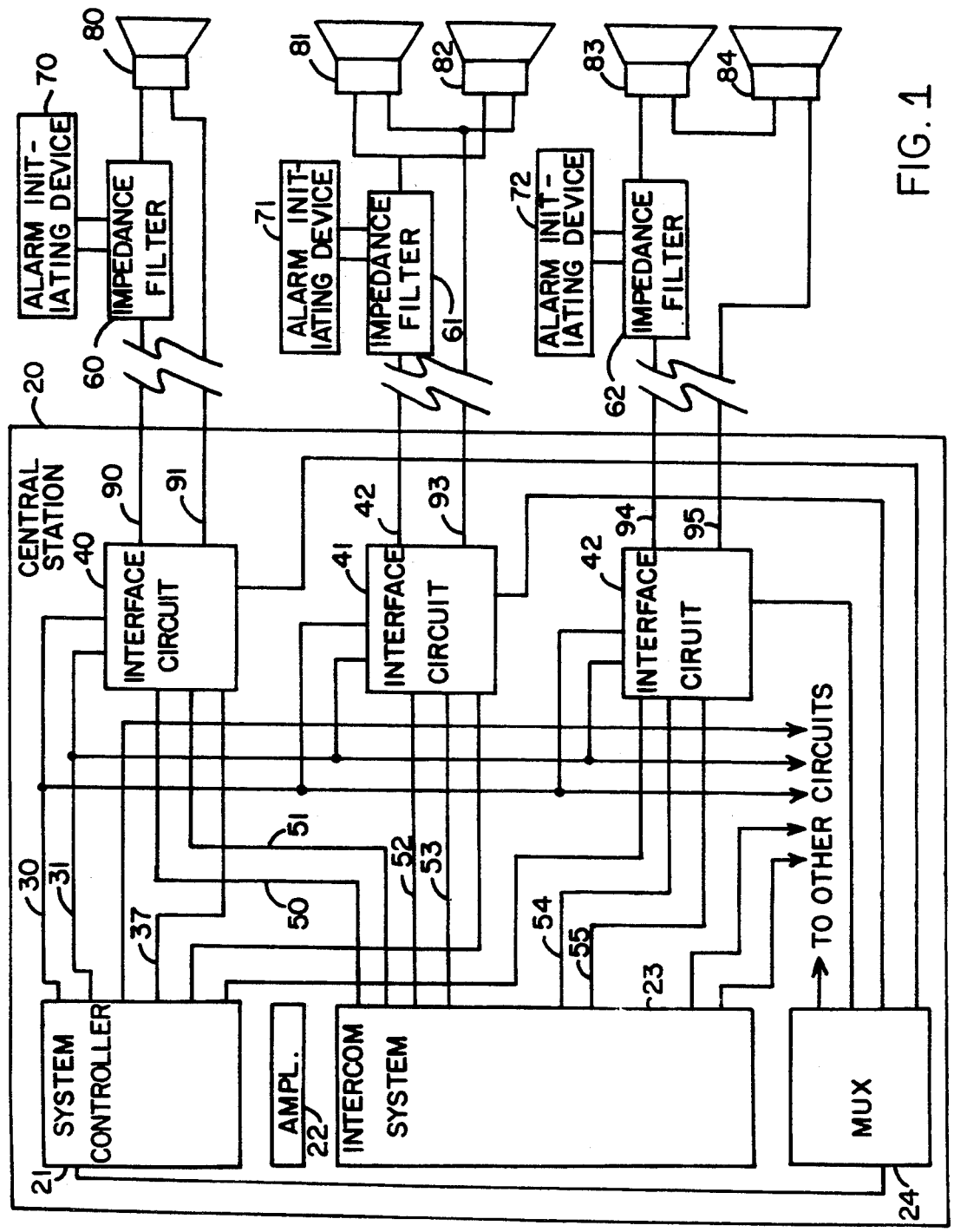
FIG. 1 is a block diagram according to the preferred embodiment of the invention showing speaker stations connected to a central switching location.

Turning now to the drawings, FIG. 1 shows a block diagram of the preferred embodiment of the system. A central switching location 20 is shown as containing a system controller 21, an amplifier 22 and intercom system 23. The amplifier is under control of the system controller 21, and is connected to the intercom system 23 under normal operation, or is provided with alarm signals for driving the speakers to sound an alarm when necessary. Typically a relay, (not shown) under the control of the system controller 21, is used to connect the selected audio source to the amplifier 22 and to return amplified signals to either the intercom 23 or the system controller 21. Thus, under normal operation, intercom system 23, along with amplifier 22, supplies audio signals as desired through wire pairs 50, 51, pairs 52, 53 and pairs 54, 55 through interface circuits 40-42 and impedance filters 60-62 for driving speakers 80-84. Interface circuits 40-42 are utilized to inject a direct current on the signal path and return a voltage (through multiplexer 24) to the system controller 21 corresponding to the direct current injected. Impedance filters 60-62 are used for routing the audio signal directly to the respective speakers 80-84, while routing the direct current through a high impedance path before traversing the speakers. If desired, alarm initiating devices 70, such as fire alarm pull stations or smoke detectors can be added to the wire pair in such a way as to influence the DC current level in the wire pair when activated. The interface circuits, alarm initiating devices and impedance filters are described in greater detail below.

Although only three groups of wires, interface circuits and speakers are illustrated, it is understood that additional groups can be driven depending on the capabilities of the intercom system chosen. Moreover, although individual speakers such as speaker 80 can be driven by the intercom system 23, speakers in a station can also be driven by a single wire pair. For example, parallel wired speakers such as speaker pair 81, 82, or series wired speakers such as speaker pair 83, 84 can also be driven by the intercom system without departing from the spirit and scope of the present invention as defined in the appended claims. The design of such speaker stations (for example by utilizing impedance matching techniques) is well known in the art. However, it will be appreciated that if some of the speaker coils, but not all, become open in a parallel wired configuration, the open coils will not be detected unless an extremely sensitive voltage detector is used. Nevertheless, the wire pair can still be sensed for an open condition with a detector of lesser sensitivity when using speakers wired in parallel.

Figure 2:
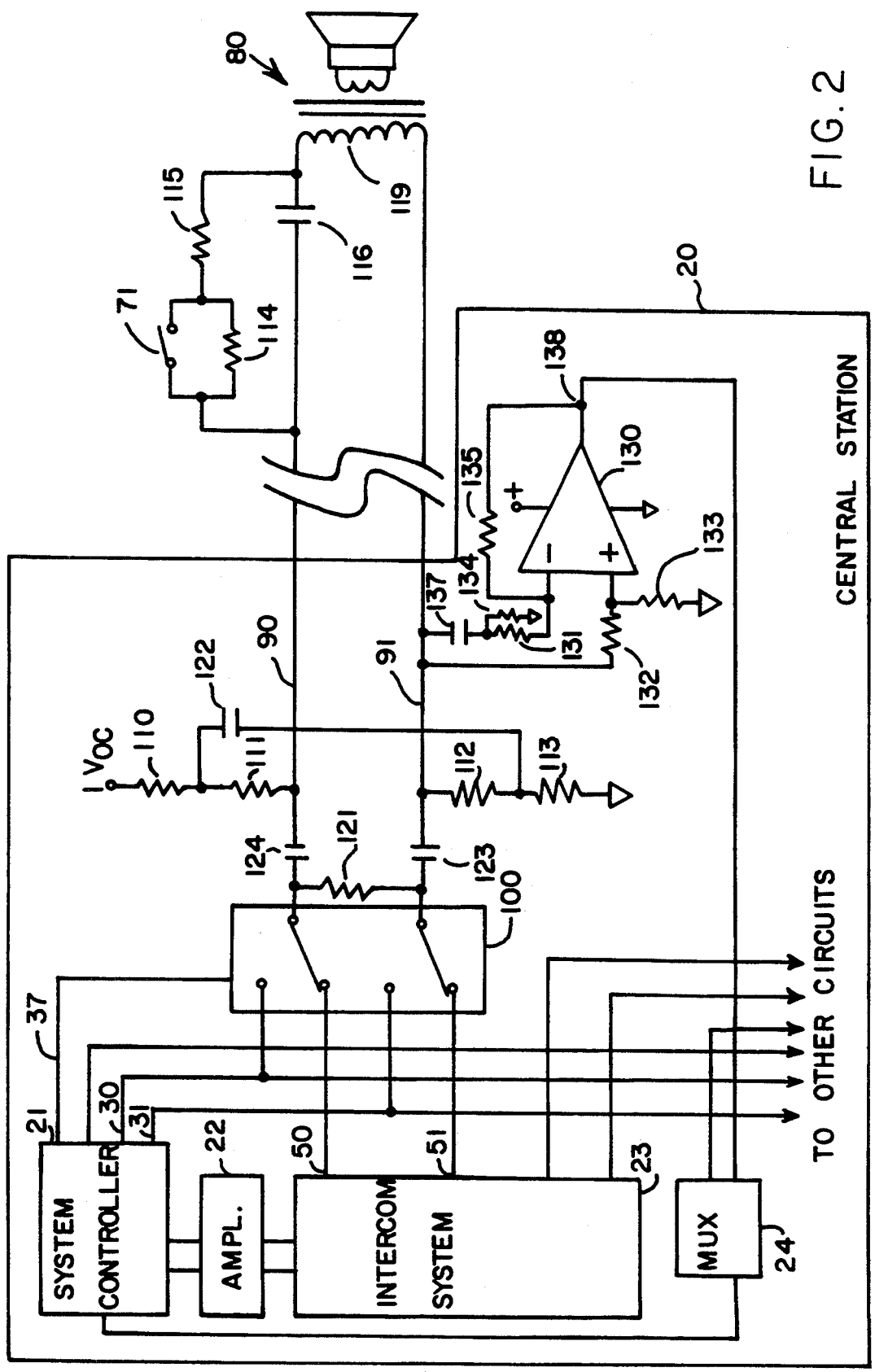
FIG. 2 is a schematic of the circuitry interfacing the central switching location to a single speaker according to the preferred embodiment of the invention.

Turning to FIG. 2, the signal path and associated electronics within the preferred embodiment that ultimately connect to single speaker 80 are shown schematically in greater detail. Although only one speaker is illustrated, it is understood that the electronics are substantially identical for the signal paths that connect to the other speakers of FIG. 1.

FIG. 2 shows intercom system 23 providing audio signals through wire pair 50, 51 to relay 100. Relay 100 is controlled by the system controller via lead 37 and is of the type that switches between two contacts. Under normal operation the relay switches amplified intercom audio signals to wire pair 90, 91. However, system controller 21 can signal relay 100 to switch and connect to wire pair 30, 31 which carries amplified alarm audio signals should the system controller 21 detect an alarm condition. Finally, should the system controller 21 detect a short in the wire pair, the system controller directs relay 100 to disconnect the wire pair 90, 91 from the amplified source. System controller 21 accomplishes this by switching the relay 100 via lead 37 so that wire pair 90, 91 becomes connected to alarm intercom wire pair 30, 31 when intercom signals are being amplified, or alternatively by connecting wire pair 90, 91 to intercom wire pair 50, 51 when alarm signals are being amplified. Since the system controller 21 determines which audio source, intercom or alarm, is being amplified by amplifier 22 and also controls the state of relay 100, the system controller 21 thus prevents the amplifier 22 from attempting to drive a shorted wire pair. Other techniques for disconnecting wire pair 90, 91 from the audio signals, such as disposing another relay (not shown) in series with either of the wires 90, 91 can also be implemented without departing from the spirit and scope of the present invention.

As shown in FIG. 2 capacitors 123 and 124 are utilized to block unwanted signals, for example DC signals from the intercom system 23, from reaching the speaker coil (impedance matching transformer) 119. It should be appreciated that resistor 121 is substantially greater in impedance than the impedance of speaker coil 119 to the audio signals, so that the amount of audio frequency current flow through resistor 121 is negligible. Additionally, capacitor 122 is utilized to help reduce crosstalk between the lines. It is understood that while these aforementioned filter components are present within the preferred embodiment, they are not necessary to the invention. However, as discussed below, capacitors 123 and 124 are also utilized in the preferred embodiment to prevent direct current from flowing into the intercom or system controller through relay 100.

In the preferred embodiment of FIG. 2, resistors 110-113 are used to inject a direct current on wire pair 90, 91. This direct current can be injected continuously or switched in during the time of evaluation, for example, by a relay (not shown). Under normal operating circumstances, the current flows through resistors 110, 111 into wire 90. Capacitor 116 blocks the DC from flowing through speaker coil 119 directly, and as a result the direct current is routed through resistor 114 (under normal circumstances), and resistor 115. However, the value of capacitor 116 is chosen so that audio signals pass directly through and drive speaker coil 119 in a low impedance path. The values of resistors 114, and 115 are chosen so as to present a substantially greater impedance path to the audio signals than does the speaker coil 119. Thus it should be apparent that the audio signals drive the speaker through a low impedance path while the much smaller in magnitude direct current only flows through coil 119 after being routed through the high impedance path.

Similarly, resistors 112, 113 and 132, 133 and 134 are chosen so that only negligible amounts of audio frequency current flow through these resistors to ground. However, the DC is blocked by capacitors 123, 124 from flowing into the intercom system or system controller through relay 100, and as a result, the direct current flows through resistors 112, 113 and 132, 133 to ground. It is understood that resistors 112, 113 provide a parallel path with resistors 132, 133 to ground, and thus the magnitude of the direct current flowing through the speaker coil under normal operating conditions can be easily calculated by those skilled in the art.

In order for the system controller 21 to detect the amount of direct current flow, an operational amplifier, configured as a differential amplifier 130 is employed. As shown in FIG. 2, audio signals reach both the inverting input and non-inverting input of differential amplifier 130. By choosing appropriate resistor values for resistors 131-135, the voltage caused by the audio current is equal on both inputs and is thus canceled. Simultaneously, the direct current flow to the inverting input is blocked by capacitor 137, but a corresponding voltage appears at the non-inverting input. Consequently, only the DC voltage is amplified, and is therefore representative of the direct current flow through wire pair 90, 91.

While the differential amplifier is employed in the preferred embodiment of the invention, many other ways of measuring the magnitude of the direct current flow are conceivable. For example, an inductor could be utilized to filter out the audio signals and the voltage could be read across a single resistor. Thus, while preferred, the differential amplifier is not necessary to the invention.

Figure 3:
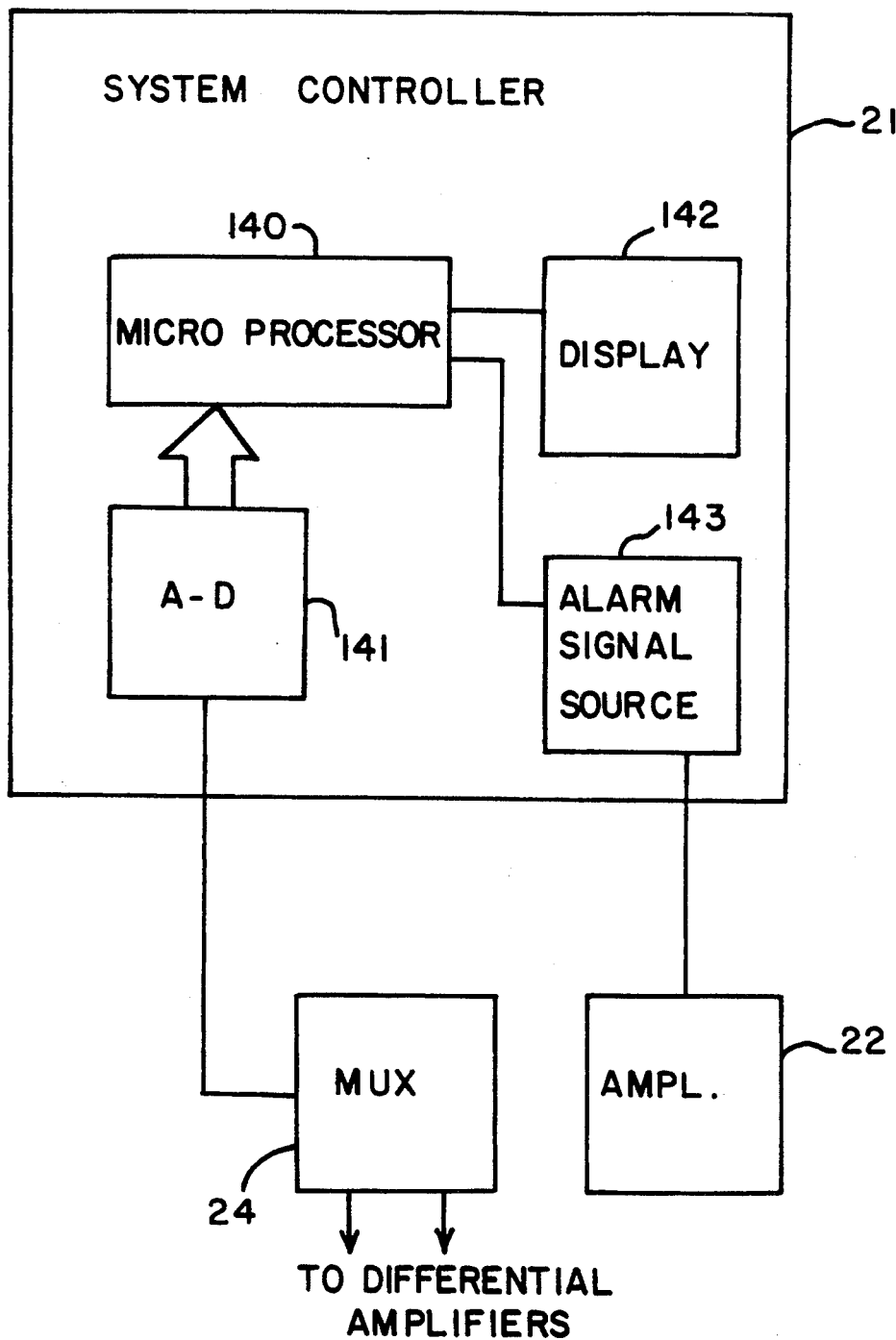
FIG. 3 is a block diagram illustrating a part of the system controller according to the preferred embodiment of the invention.

As shown in FIG. 3, the system controller 21 includes detection means, for example a microprocessor 140 associated with an analog-to-digital voltage converter 141, or A-D converter. The system controller 21 also includes control means, which in the preferred embodiment comprises a display 142 and an alarm signal source 143, both controlled by the microprocessor 140.

Figure 4:
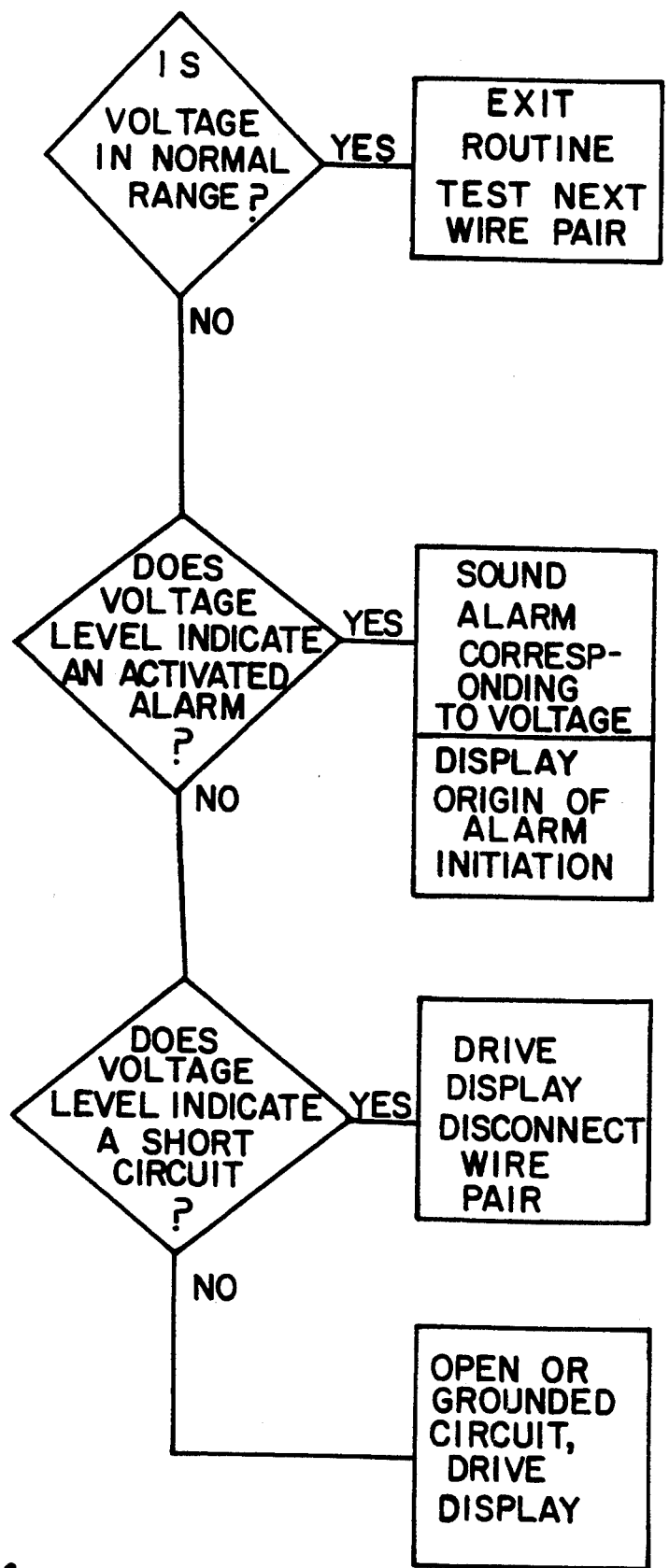
FIG. 4 is a flowchart representing the steps taken by the system controller in evaluating the path integrity and the status of alarm initiating devices according to one embodiment of the invention.

In the preferred embodiment, the A-D converter 141 receives the voltage corresponding to the direct current in the wire pair through multiplexer 24 (from the differential amplifier 130 of FIG. 2) and transfers a digitized value to the microprocessor 140. The microprocessor 140 evaluates this digitized voltage and takes appropriate action in accordance with the flowchart of FIG. 4. Thus, as shown in FIG. 4, the display 142 or alarm signal source 143 will be controlled if anything other than a normal voltage is detected. For example, the display 142 will indicate the nature of any faults detected in the path integrity of the wire pair, and also the origin of an activated alarm indicating device, while the alarm signal source 143 will provide the appropriate alarm signals to the amplifier 22 when the voltage indicates that an alarm initiating device has been activated.

The actual voltage is then compared with stored values, such as with values coded into software or stored in a look-up table, and the status of the line and alarms is determined based on the result of the comparison. For example, one voltage level would indicate a short circuit, another might indicate a fire alarm, yet another might indicate a burglar alarm, another an open circuit, and so on.

While an analog to digital voltage converter is utilized in the preferred embodiment to obtain a voltage reading, many other methods for receiving and evaluating a voltage are well known in the art, and can be utilized without departing from the spirit and scope of the present invention. For example, arranging voltage comparators to trigger at certain levels would also provide signals indicative of the current levels present in the wire pair.

FIG. 2 shows the output 138 of the differential amplifier 130 connected to a multiplexer 24. Returning to FIG. 1, multiplexer 24 allows the system controller to scan the voltages from numerous signal paths. However, multiplexer 24 is not necessary to the invention, even when using multiple signal paths, as many configurations for connecting the differential amplifier output to the system controller are conceivable. Nevertheless, in the preferred embodiment, a multiplexer is used to enable the system controller to scan multiple sets of wire pairs to ensure path integrity and to assess the status of alarm initiating devices.

As shown in FIG. 2, multiplexer 24 is present to allow the system controller to scan numerous voltages resulting from current flow in other wire pairs. In the preferred embodiment, a multiplexer 24 is used for switching the voltages (corresponding to the currents in wire pairs and speakers) for every group of twenty-five wire pairs. Accordingly, for systems having more than twenty-five wire pairs, more than one multiplexer is connected to the differential amplifier outputs in a similar fashion to multiplexer 24.

It should be apparent that should wire pair 90, 91 become shorted, the DC will flow through the short instead of through resistors 114, 115. A voltage different from the voltage detected under normal conditions will appear at the output 138 of differential amplifier 130. Thus, by evaluating the voltage, the system controller could detect a short, and take appropriate action such as driving a display indicative of the problem. Moreover, in the event of a short, the system controller 21 disconnects the shorted wire pair by switching relay 100 to connect with the audio source, (intercom or alarm), that is not being amplified. A relay, (not shown), under the control of the system controller 21, connects the proper audio source to the amplifier 22. Consequently, in the event of an alarm, amplified alarm signals will still be able to drive other speakers on other wire pairs since shorted wire pairs will be connected to the unamplified intercom wire pair. Without this capability, a short in one wire pair would make it impossible to drive other wire pairs.

Should wire pair 90, 91 or speaker coil 119 become open or grounded, the DC will not flow through to amplifier 130, resulting in zero voltage at the inputs of differential amplifier 130. (Note that resistors 133 and 134 will pull these inputs to ground.) Accordingly, these conditions are also easily detected by the system controller, which can signal the proper personnel of the problem.

Another important aspect of the system is the ability to connect alarm initiating devices to the same wire pair that is used to carry audio signals. Since the system controller reads the voltage proportional to the current flow in the wires, all that is necessary is that the activation of such an alarm initiating device changes the magnitude of the current flow in the wire pair in a detectable manner. Indeed, numerous alarm initiating devices can be connected to the wire pair at any location, and therefore such devices need not be separately wired to the system controller.

For example, FIG. 2 shows a switch 71 that when closed, will change the impedance of the DC path, since current will flow through the switch contact rather than resistor 114. Such a switch might be a fire alarm pull station, a smoke alarm, or a burglar alarm. Because the current changes on the line, the system controller 21 will receive a voltage level that indicates the activation of an alarm. The system controller 21 can then pinpoint the problem and take appropriate action such as sounding an alarm or driving a display to notify appropriate personnel.

It should be appreciated that multiple alarm initiating devices can be added to the path in various ways, as all that is necessary is that the device alter the current flow in a recognizable manner. By carefully tailoring resistor values to the alarm initiating devices chosen, the control system is able to differentiate between the types of devices. Moreover, by choosing the proper resistor values, even if alarm initiating devices on the same line are triggered simultaneously, the system controller will detect a voltage indicating the parallel combination of these devices.

While FIG. 2 shows a simple way to configure one type of alarm initiating device, i.e., a switch 71 bypassing a series resistor 114, it is understood that many other configurations and types of alarm initiating devices are feasible. All that is necessary is that the device be configured to alter the current flow in the wire pair in some detectable manner.

In summary, alarm initiating devices can be connected to the same audio pair of wires and if desired, the system controller can differentiate between the types of devices because of the change in current flow caused by the triggering of such a device. If properly designed, voltages corresponding to the current flow can be unique for each of the error conditions and alarm conditions, all of which are separate from the voltage detected under the normal operating condition.

While a direct current has been chosen in the preferred embodiment, many other distinctive signals could be injected onto the wire pair and specifically analyzed to determine path integrity or alarm status without departing from the spirit and scope of the present invention as defined by the appended claims. For example, high frequency pulses could be injected onto the audio wire pair, pass through the speaker, and by utilizing appropriate filters, be separated from the audio signals. Open or grounded circuits, short circuits, and alarms would then be configured to modify the frequency or amplitude of the pulses. Based on the type and/or the amount of the pulse modification, the signal would then be analyzed in a manner similar to the voltage analysis performed for the injected direct current, so that the path integrity and status of alarm indicating devices would be known from the results of the signal analysis.

What is claimed is:

1. A supervision circuit for monitoring the path integrity in an audio system, in which the audio system is of the type having a central switching location driving at least one speaker via a wire pair connecting the central switching location to the speaker, the supervision circuit comprising, in combination:
   a source at the central switching location for injecting a distinctive signal onto the wire pair which drives the speaker, such that the signal passes through the speaker without disconnecting the wire pair and speaker from the audio system;
   a detector at the central switching location for responding to the signal on the same wire pair and evaluating the path integrity based on the condition of the signal; and
   a controller responsive to the status of the integrity of the connected wire pair and the speaker for indicating the nature of the signal detected.

2. The supervision circuit of claim 1 wherein the distinctive signal is a direct current (DC), and the detector responds to a level of the DC on the wire pair and evaluates the path integrity based on the magnitude of the DC.

3. The supervision circuit of claim 2 further comprising a blocking capacitor associated with the speaker, and a bypass shunt associated with the speaker for completing a path for the injected DC from the wire pair through the speaker, so that the injected DC the central switching location traverses the wire pair and the speaker.

4. A supervision circuit for monitoring path integrity in an audio system, where the audio system includes a central switching location driving at least one speaker with audio signals through a wire pair connecting the central switching location to the speaker, the speaker being of the type which includes a DC blocking capacitor, the supervision circuit comprising the combination of:
   a DC source at the central switching location connected to the wire pair for injecting a current onto the wire pair without disconnecting the wire pair and speaker from the audio system;
   a DC shunt connected across the capacitor at the speaker for passing the injected DC current through the wire pair and the speaker;
   a detector connected to the wire pair at the central switching location and having an input adapted to monitor the DC current level on the wire pair to verify the path integrity; and
   a controller for indicating the nature of any fault detected.

5. The supervision circuit of claim 3 wherein the detector detects a first current level indicative of a good circuit in the wire pair, a second current level different from the first current level indicative of a short circuit in the wire pair and a third current level different from the first and second current levels indicative of an open circuit or grounded wire in the wire pair.

6. The supervision circuit of claim 5 further comprising a switching device for electrically disconnecting the wire pair from amplified audio driving signals when the detected current indicates a short circuit.

7. The supervision circuit of claim 1 wherein multiple sets of wire pairs are utilized to drive multiple sets of speakers.

8. The supervision circuit of claim 7 wherein the detector polls the sets of wire pairs to evaluate the signals in the sets of wire pairs.

9. The supervision circuit according to claim 8 wherein a multiplexer is utilized for polling the sets of wire pairs.

10. The supervision circuit according of claim 8 wherein the source injects DC current into the wire pair concurrent with the polling of the detector.

11. The supervision circuit according of claim 8 wherein the source injects DC current continuously into the wire pair.

12. An integrated speaker supervision and alarm circuit for monitoring the path integrity in an audio system and the status of an alarm initiating device, in which the audio system is of the type having a central switching location driving at least one speaker via a wire pair connecting the central switching location to the speaker, the supervision and alarm circuit comprising, in combination:
   a source at the central switching location for injecting a distinctive signal onto the wire pair which drives the speaker, such that the signal passes through the speaker;
   an alarm initiating device for influencing the distinctive signal on the wire pair when activated, such that when activated the signal differs from the signal injected when not activated;
   a detector at the central switching location for responding to the signal on the wire pair and evaluating the path integrity and the status of the alarm initiating device based on the condition of the signal;

13. A supervision circuit for monitoring the path integrity in an audio system and the status of an alarm initiating device, in which the audio system is of the type having a central switching location driving at least one speaker via a wire pair connecting the central switching location to the speaker, the speaker having a blocking capacitor associated therewith, the supervision circuit comprising, in combination:

a source at the central switching location for injecting a DC current onto the same wire pair which drives the speaker;

a bypass shunt associated with the speaker for bypassing the blocking capacitor and completing a path for the injected DC current from the wire pair through the speaker, so that the injected DC current at the central switching location transverses the wire pair and the speaker;

an alarm initiating device for influencing the DC current level injected on the wire pair when activated to a DC current level distinct from the DC current level injected on the wire pair when not activated;

a detector at the central switching location for responding to the DC current level on the wire pair and evaluating the path integrity and the status of the alarm initiating device based on the magnitude of the detected current; and a controller responsive to the status of the integrity of the connected wire pair and the speaker and the status of the alarm initiating device for indicating the nature of the current detected.

14. The supervision circuit of claim 13 wherein multiple sets of wire pairs are arranged to drive multiple sets of speakers, and at least one set of initiating devices is connected to at least one of the wire pairs.

15. The supervision circuit of claim 13 wherein multiple sets of initiating devices are connected to multiple sets of wire pairs.

16. The supervision circuit according of claim 13 wherein the bypass shunt provides a substantially high impedance path for direct current relative to the impedance of the speaker.

17. The supervision circuit according of claim 13 wherein a differential amplifier converts the direct current to a corresponding voltage for detection.

* * * * *

UNITED STATES PATENT AND TRADEMARK OFFICE
CERTIFICATE OF CORRECTION

PATENT NO. : 5,345,510
DATED : SEPTEMBER 6, 1994
INVENTOR(S) : DILIP SINGHI AND KAMLESH V. PATEL

It is certified that error appears in the above-identified patent and that said Letters Patent is hereby corrected as shown below:

Column 3, line 28, after "so that" delete "the".

Column 10, line 33, delete "of" and substitute therefor -- to --;

Column 10, line 36, delete "of" and substitute therefor -- to --;

Column 10, line 60, after "of the signal;" insert following -- a controller responsive to the status of the integrity of the connected wire pair and the speaker and the status of the alarm initiating device for indicating the nature of the signal detected. --;

Column 12, line 12, delete "of" and substitute therefor -- to --; and

Column 12, line 16, delete "of" and substitute therefor -- to --.

Signed and Sealed this

Twenty-fourth Day of January, 1995

Attest:

BRUCE LEHMAN

*Attesting Officer*     *Commissioner of Patents and Trademarks*